United States Patent [19]

Rodder et al.

[11] Patent Number: 5,198,378
[45] Date of Patent: Mar. 30, 1993

[54] PROCESS OF FABRICATING ELEVATED SOURCE/DRAIN TRANSISTOR

[75] Inventors: Mark S. Rodder; Richard A. Chapman, both of Dallas, Tex.

[73] Assignee: Texas Instruments Incorporated, Dallas, Tex.

[21] Appl. No.: 609,969

[22] Filed: Dec. 10, 1990

Related U.S. Application Data

[63] Continuation of Ser. No. 265,085, Oct. 31, 1988, abandoned.

[51] Int. Cl.[5] .......................................... H01L 21/265
[52] U.S. Cl. ........................................ 437/41; 437/89; 437/192; 257/900; 257/384
[58] Field of Search ............................ 437/41, 192, 89

[56] References Cited

U.S. PATENT DOCUMENTS

| | | | |
|---|---|---|---|
| 4,035,829 | 7/1977 | Ipri et al. | 357/59 G |
| 4,072,545 | 2/1978 | De La Moneda | 357/23.9 |
| 4,306,915 | 12/1981 | Shiba | 437/41 |
| 4,374,700 | 2/1983 | Scott et al. | 437/200 |
| 4,463,491 | 8/1984 | Goldman et al. | 437/200 |
| 4,549,199 | 10/1985 | Yamauchi et al. | 357/59 G |
| 4,569,122 | 2/1986 | Chan | 437/192 |
| 4,685,196 | 8/1987 | Lee | 437/41 |
| 4,753,709 | 6/1988 | Welch et al. | 357/67 S |
| 4,800,177 | 1/1989 | Makamae | 148/DIG. 147 |
| 4,816,425 | 3/1989 | McPherson | 437/192 |
| 4,825,267 | 4/1989 | Maas | 357/23.9 |
| 4,866,009 | 9/1989 | Matsuda | 437/192 |
| 4,874,719 | 10/1989 | Kurosawa | 437/192 |
| 4,945,070 | 7/1990 | Hsu | 357/59 I |

FOREIGN PATENT DOCUMENTS

| | | | |
|---|---|---|---|
| 54-8475 | 1/1979 | Japan | 357/23.11 |
| 0050640 | 12/1980 | Japan | 437/41 |
| 56-158482 | 12/1981 | Japan | 357/23.9 |
| 57-149774 | 9/1982 | Japan | 357/23.9 |
| 0124871 | 3/1985 | Japan | 357/23.11 |
| 62-216273 | 9/1987 | Japan | 357/23.1 |
| 63-142677 | 6/1988 | Japan | 357/23.1 |

OTHER PUBLICATIONS

El-Diwany et al., "Use of the Polysilicon . . . LDD Structures", IEEE, vol. 35, No. 9, Sep. 1988.
Wong et al., "Elevated Source/Drain MOSFET", IEDM, 1984.

*Primary Examiner*—Olik Chaudhuri
*Assistant Examiner*—Long Pham
*Attorney, Agent, or Firm*—Douglas A. Sorensen; Richard L. Donaldson

[57] ABSTRACT

An elevated transistor is provided having minimized junctions (33) and a polysilicon pad (27) over the transistor insulating regions (12) and partially over the moat (14). A conductive layer (32) overlays the polysilicon pad (27) and partially overlays the moat (14) in the interim areas (29).

20 Claims, 1 Drawing Sheet

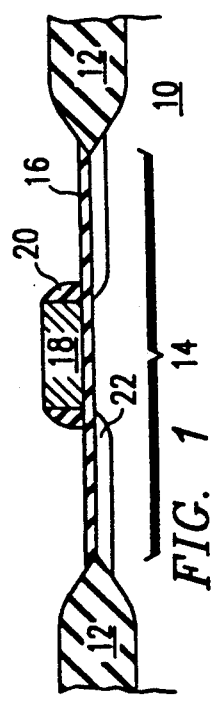
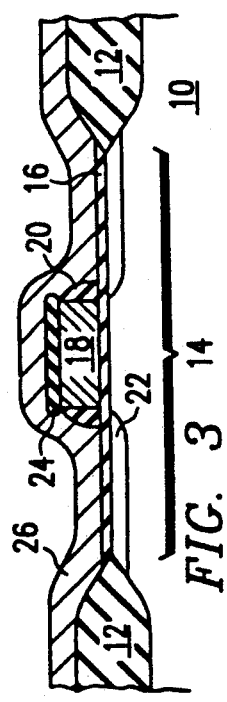
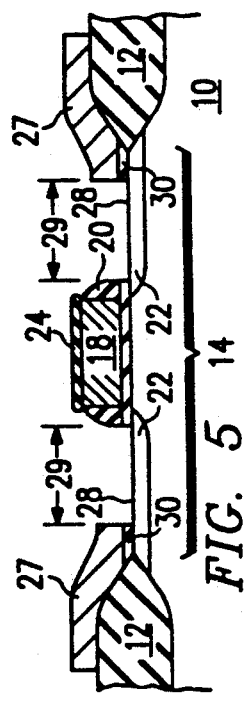
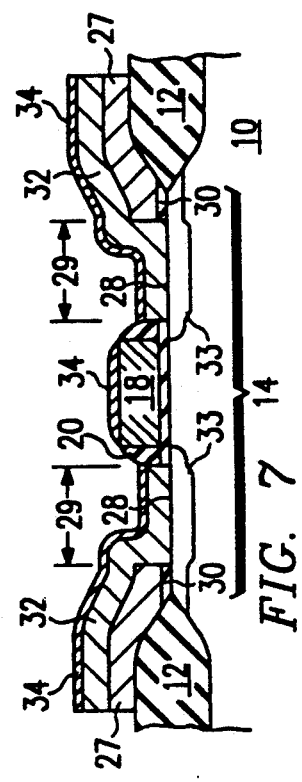
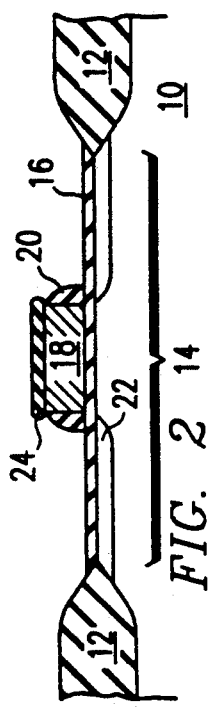
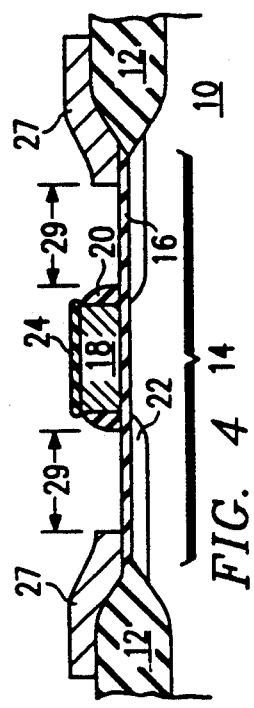
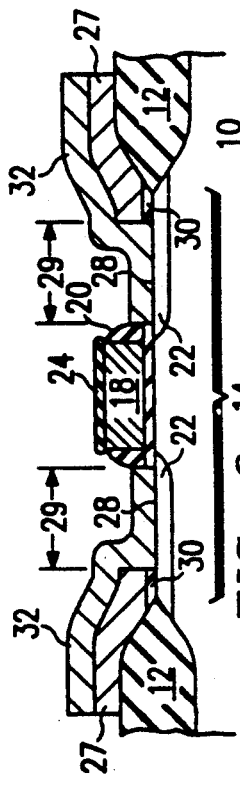
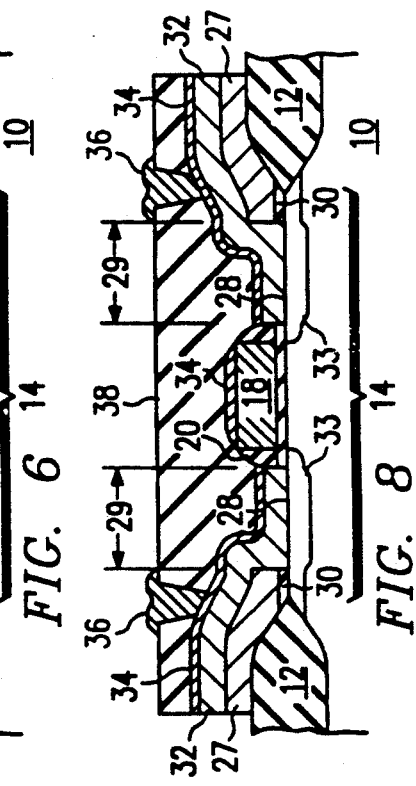

PROCESS OF FABRICATING ELEVATED SOURCE/DRAIN TRANSISTOR

This is a continuation of application Ser. No. 07/265,085, filed Oct. 31, 1988, now abandoned.

TECHNICAL FIELD OF THE INVENTION

This invention pertains to integrated circuit fabrication, and more particularly to a transistor with elevated source/drain (moat) regions and the process of fabrication thereof.

BACKGROUND OF THE INVENTION

Under current MOSFET transistor technology, problems associated with short channel effects, source/drain (moat) junction capacitance, reliability and packing density arise as MOSFET technology is scaled to smaller dimensions.

MOSFET short channel effects increase as the source/drain junction depth increases. Thus, it is desirable to minimize the depth of such junctions, especially as the length of the transistor decreases. One approach to minimizing source/drain junction depth, with respect to the gate oxide/silicon substrate interface, is to form raised source/drain regions.

MOSFET source/drain junction capacitance increases as source/drain junction area increases. Thus, it is desirable to minimize the moat area, which will also improve the packing density of integrated circuits. One approach is to form contacts from metal 1 to the source/drain regions over field oxide, rather than directly over the moat regions.

Under standard MOS transistor design, the source/drain area must considerably exceed the contact to metal 1 size to prevent junction leakage into the underlying substrate. This is a result of potential etching error due to misalignment of the contact to metal 1 over the source/drain area. If the contact overlies the source/drain, the contact etch may penetrate the PN junction edge of the source/drain, thereby short-circuiting that junction. However, if the contact can overlie field oxide, there is no need for the larger source/drain area. Thus, the source/drain area may be reduced with a corresponding reduction in size of the transistor. Reduced transistor size gives rise to higher packing density.

Previously developed attempts to form a conducting layer from moat over field oxide in addition to the formation of raised moat regions have created attendant problems. Quite often, the processes involved are complicated and require extreme process control.

One such prior attempt comprises the non-reactive UPMOS process. This process deposits source/drain polysilicon over a patterned gate structure followed by resist planarization and etch-back. The etch removes the polysilicon over the gate, while not removing the polysilicon over the moat and field oxide regions. This process has the disadvantages of utilizing a resist-etch-back (REB) process to define the final thickness of the polysilicon over the moat regions. In particular, the REB process does not utilize an etch-stop layer and thus can lead to difficulty in control and uniformity of the final polysilicon thickness over moat. It should be noted that the final polysilicon thickness ultimately determines the source/drain junction depth of the resulting MOSFET device.

A second prior art solution is the reactive UPMOS process. In this process, a dopant diffusion source over a patterned gate is used to dope the polysilicon deposited over the patterned gate, followed by a selective etch process. In this process, the doped polysilicon (over the gate) is etched faster than the undoped polysilicon which lies over the moat and field oxide regions. This process has several disadvantages. First, the use of a diffusion process to dope the overlying polysilicon is unreliable. The diffusion process is not precisely controllable due to both interfacial oxide effects between the dopant source and the overlying polysilicon and also due to the adverse characterized diffusion of dopants in polysilicon. Second, a selective etch with no etch-stop mask can cause difficulties in the control and uniformity of precise polysilicon thickness over moat. Third, a high gate-to-source/drain capacitance can result if insufficient dopant diffusion reaction causes the remaining polysilicon thickness over moat to be equivalent to the thickness of the gate stack.

A third prior art solution has comprised a TiN process which forms a TiN layer extending from the moat over the field oxide regions. This process, even if used in conjunction with selective epitaxy to form raised moat regions, requires a large moat width (and thus area) since the TiN layer must overlap the moat by approximately 0.8 um to satisfy minimum contact resistance requirements. Due to large moat width, there is a consequent requirement of larger device size. Further, the larger moat area required by the TiN process thus results in an increased source/drain junction capacitance.

Therefore, a need has arisen for a simple and more reliable process to create a transistor with raised source/drain regions and with a conducting layer extending from moat regions over field oxide regions.

SUMMARY OF THE INVENTION

In accordance with the present invention, a new and improved source/drain transistor process is provided which substantially reduces or eliminates the disadvantages and problems associated with prior transistors having both raised moat regions and a conducting layer extending from moat over field oxide.

In accordance with the present invention, a transistor is formed having a gate oxide over a semiconductor surface and between opposing moat insulating regions. A gate is formed over the gate insulator. Sidewall insulators are formed adjacent the gate. A polysilicon layer is formed over the opposing moat insulating regions and partially over the semiconductor surface, thereby defining interim areas between the sidewall insulators and the edge of the polysilicon. A conductive layer is then formed selectively over the polysilicon layer and in the interim areas. Source/drain regions are then implanted in the moat area. Silicided regions are then formed over the conductive layer and can be connected to local interconnects.

With the present invention, the overlap of the polysilicon layer over moat need only be on the order of 0.3 um, thereby reducing device size. Reduced device size has the technical advantages of increasing packing density and reducing source/drain junction capacitance.

Important aspects of the present invention include the reduction of large overlap requirements associated with former processes. Under the present invention, large overlap of the polysilicon layer over moat is not required to minimize contact resistance. A small overlap of the polysilicon layer over moat is required to account for misalignment error with respect to the edge of the field oxide. However, such overlap is minimal due to the fact that such oxide is etched away before depositing a conductive layer. Further, in the present invention, misalignment tolerance is reduced by approximately the thickness of the conductive layer as it forms a sidewall along the previously patterned polysilicon layer, thereby reducing the tolerance for defining the polysilicon over moat.

In comparison to prior processes, the present invention utilizes well controlled etch techniques to define the polysilicon layer. This is effected by utilizing an underlying oxide layer as an etch-stop layer when defining the polysilicon layer. The use of this etch-stop layer provides the technical advantage of improved control and uniformity across the wafer, since the etching need not be a timed etch and allows for the use of overetch without altering any resultant thickness of polysilicon over the moat regions.

In addition, an important technical advantage of the invention is the use of a second conductiv layer to subsequently form the raised moat regions while enabling an electrical connection between the moat and the polysilicon layer over the insulating regions. In an alternative embodiment the connection between the two materials is a nonrectifying electrical connection, and the layer over the insulating regions is a moncrystalline semiconductor material or a noncrystalline semiconductor material overlaying a conductor. This structure has the technical advantage that the silicon thickness in the moat regions can be well controlled and is also independent of the thickness of the polysilicon layer. The control obtained from using selective deposition of a conductive layer provides the technical advantage of precise determination of source/drain junction depth. It is noted that the source/drain junction depth (with respect to the gate oxide/silicon substrate interface) is reduced by the thickness of the conducting layer, thus leading to shallow, heavily doped junctions. This decreased junction depth for the heavily doped regions leads to improved MOSFET performance and a reduction in MOSFET short channel effects.

Another technical advantage is that control of the thickness of the selectively deposited conducting layer is also important to minimize the gate-to-source/drain capacitance. Gate-to-source/drain capacitance increases as the thickness of the conducting layer increases. Therefore, by controlling the precise thickness of the conducting layer, MOSFET device performance can be optimized with respect to both the junction depth and gate-to-source/drain capacitance issues. The thickness of the conducting layer can be easily controlled to be much less than the height of the gate thus leading to reduced gate-to-source/drain capacitance compared to prior processes.

Finally, a structure is created wherein the moat silicon is effectively extended over the field insulating region. With this extension, the contact to metal 1 need not be centered in the moat regions, but may instead be positioned partially or entirely over the field insulating region. This provides the technical advantage of allowing the etching process for the contact hole to be effected either partially or entirely over the insulating regions rather than over moat. Therefore, the possibility of etch damage to the device in the moat region, and corresponding increase in junction leakage current in the moat regions, can be eliminated. Another technical advantage is that the moat area is substantially reduced by forming the contact over the insulating region.

BRIEF DESCRIPTION OF THE DRAWINGS

For a more complete understanding of the present invention and the advantages thereof, reference is now made to the following descriptions, taken in conjunction with the accompanying drawings, in which:

FIG. 1 illustrates a cross-sectional side view of the transistor of the present invention after a first processing stage;

FIG. 2 illustrates a cross-sectional side view of the transistor of the present invention after a second processing stage;

FIG. 3 illustrates a cross-sectional side view of the present transistor after a third processing stage;

FIG. 4 illustrates a cross-sectional side view of the transistor of the present invention after a fourth processing stage;

FIG. 5 illustrates a cross-sectional side view of the transistor after a fifth processing stage;

FIG. 6 illustrates a cross-sectional side view of the transistor of the present invention after a sixth processing stage;

FIG. 7 illustrates a cross-sectional side view of the transistor of the present invention after a seventh processing stage; and FIG. 8 illustrates a cross-sectional side view of the transfer of the present invention after an eighth processing stage.

DETAILED DESCRIPTION OF THE INVENTION

The preferred embodiment of the present invention is illustrated in FIGS. 1-7 of the drawings, like numerals being used to refer to like and corresponding parts of the various drawings. FIGS. 1-7 illustrate cross-sectional side views of the present invention throughout various processing steps.

FIG. 1 illustrates a cross-sectional side view of the silicon substrate 10 after a first processing stage. Patterned insulating regions 12 are formed on the silicon substrate 10, defining a moat region 14 isolated by the insulating regions 12. Typically, the insulating region 12 is formed by growing a field oxide on the silicon substrate 10, which has been masked by a patterned layer such as silicon nitride to prevent oxidation over moat region 14. A gate insulator 16 is formed along the surface of the silicon substrate 10 between the insulating regions 12, typically grown at a thickness of 50-200 angstroms. A gate 18 is deposited above the gate insulator 16. Typically, the gate 18 comprises highly doped polysilicon layer which is etched by a conventional techniques to the desired configuration. Shallow junctions 22 may be optionally implanted throughout the moat region 14, but do not form under the gate 18. For NMOS transistors, the doping for the shallow junctions 22 typically results in an arsenic surface concentration of approximately $10^{17}$–$10^{19}$/cm$^3$. The use of arsenic as a dopant is merely exemplary and it is to be understood that alternative dopants known in the art may be utilized. For PMOS transistors, the dopant for shallow junctions 22 may be boron. The depth of the shallow junctions 22 is on the order of 0.1 μm or less. Sidewall insulators 20 are formed on the sidewalls of the gate 18. Typically, these sidewall insulators 20 comprise an oxide.

FIG. 2 illustrates a cross-sectional side view of the present invention after a second processing stage. A masking region 24 is formed over the gate 18. Such a mask may be created by growing an oxide over the gate 18. Since the polysilicon gate 18 is usually highly doped, and because oxidation occurs more rapidly over a heavier doped semiconductor, the oxide thickness over the polysilicon gate 18 will be larger than in the moat region 14. This thicker oxide will typically be on the order of 1000 angstroms in thickness and will be used to protect the polysilicon gate 18 during subsequent steps. It is to be noted that the structure depicted in FIG. 2 may be created by processes other than that described above. As such, the aforementioned processes are merely exemplary and the Applicants do not intend to limit their invention thereto.

FIG. 3 illustrates a cross-sectional side view of the present invention following a third processing stage. In FIG. 3, a layer of polysilicon 26 of desired thickness has been placed over the entire transistor structure. While the thickness of layer 26 will vary according to desired criteria, layer 26 will typically be 1000–4000 angstroms in thickness.

FIG. 4 illustrates a cross-sectional side view of the present invention following a fourth processing stage. The deposited polysilicon 26 of FIG. 3 is patterned such that it remains over the insulating regions 12 and overlaps the moat region 14 by a desired distance. This patterned layer creates spaced apart polysilicon pads 27 and defines interim areas 29 between the polysilicon pads 27 and the sidewall insulators 20.

FIG. 5 illustrates a cross-sectional side view of the present invention subsequent to a fifth processing stage. The gate insulator 16 (see FIG. 4) within the interim area 29 is etched away leaving exposed substrate surfaces 28. Because of its larger thickness, the masking region 24 will partially remain after this etching step. Insulation 30 remaining under the polysilicon pad 27 serves to further reduce the junction capacitance of the transistor structure.

FIG. 6 illustrates a cross-sectional side view of the present invention following a sixth processing stage. A conductive layer 32 is formed selectively over the polysilicon pad 27 and over the exposed substrate surfaces 28 in the interim areas 29. This conductive layer 32 is commonly formed by using a selective epitaxial silicon deposition process. Since the epitaxial silicon will grow only over silicon areas, the growth is limited within interim area 29 on the exposed substrate 28 and on the polysilicon pad 27 extending from the moat 14 over the insulating region 12. The epitaxial silicon will not grow over the gate masking region 24, nor over the sidewall insulators 20.

FIG. 7 illustrates a cross-sectional side view of the present invention following a seventh processing stage. The masking region 24 over the gate 18 is removed. Source/drain regions are formed by implantation into the conductive layer 32 thereby creating a deeper source/drain junction 33. Typically, doping results in a surface concentration of $10^{20}/cm^3$ at the interface of the conductive layer 32 and the silicided region 34. An example of common dopants includes arsenic or phosphorous for NMOS transistors, and boron for PMOS transistors. The optional use of shallow junction 22 (discussed in reference to FIG. 1) will be necessary depending on the lateral extent of deeper source/drain junction 33. Shallow junctions 22 should be used only to the extent that deeper junction 33 does not extend under and past the region below sidewall insulators 20. The junction depth corresponding to the heavily doped region below the substrate surface 28 will be on the order of 0.5–0.15 μm. It is noted that the final junction depth below the substrate surface 28 is determined both by the thickness of the conductive layer 32 as well as the implant energy used to dope the conductive layer 32. Hence, the final junction depth can be controlled by varying these parameters. Silicided regions 34 are formed over each conductive layer 32 while the sidewall insulator 20 prevents contact with the gate 18. FIG. 7 thus illustrates the formation of an improved transistor having an elevated source/drain region with a conducting layer 32 extending from moat 14 over field insulating regions 12.

FIG. 8 illustrates the improved transistor of FIG. 7 having a metal-1 contact 36 added thereto. An inter-level oxide layer 38 is disposed over the entire transistor structure. The metal 1 contact 36 etch is effected through inter-level oxide layer 38. The metal 1 contacts 36 are formed to the silicided region 34. Because the metal-1 contacts 36 may overlie the insulating regions 12, the etch for the contact 36 may be effected over the insulating region 12 rather than over the moat 14. Thus, the possibility of etch damage to the moat 14 is eliminated.

The process and resulting product of the present invention provide many advantages over the prior art. A less complicated and problematic process is disclosed to produce an elevated source/drain transistor having reduced junction depths 33. Additionally, the transistor will have a conductive layer 32 which in effect extends silicon over the transistor insulating regions 12. As such, external contacts to the transistor need not be centered in the moat region 14 between the insulating regions 12 and the sidewall insulators 20. Instead, external contacts 36 may be placed within the conductive layer 32 over either the interim region 29 or the insulating region 12.

Although the present invention has been described in detail, it should be understood that various changes, substitutions and alterations can be made herein without departing from the spirit and scope of the invention as defined by the appended claims.

What is claimed is:

1. A method for forming a transistor, comprising the steps of:

forming insulating regions surrounding an active device area in a face of a substrate;

forming a gate insulating layer on the surface of said active device area, forming a gate on said gate insulating layer;

forming sidewall insulating layers on the sidewalls of said gate;

forming at least a first conductive layer on said gate insulating layer, said first conductive layer extending onto said insulating regions;

removing the portion of said gate insulating layer between said first conductive layer and said sidewall insulating layers; and forming by selective epitaxial deposition a second conductive layer, said selective deposition being selective to the exposed portion of said substrate and said first conductive layer.

2. A method as in claim 1 further comprising the steps of:

forming a third conductive layer on said gate insulating layer, aid third conductive layer extending onto said insulating regions, said third conductive layer being positioned in opposition to said first conductive layer relative to said gate, said gate being positioned between said first and third conductive layers;

removing the portion of said gate insulating layer between said third conductive layer and said sidewall insulating layers; and forming by selective epitaxial deposition a fourth conductive layer, said selective deposition being selective to the exposed portion of said substrate and said third conductive layer.

3. A method as in claim 1 further comprising the step of forming a doped region in said substrate by diffusing dopant atoms from said second conductive layer into said substrate.

4. A method as in claim 2 further comprising the step of forming a source and a drain in said substrate by diffusing dopant atoms from said second and fourth conductive layers into said substrate.

5. A method as in claim 1 wherein said insulating regions comprise silicon dioxide regions formed by thermal oxidation.

6. A method as in claim 1 wherein said substrate comprises crystalline silicon.

7. A method as in claim 1 further comprising the step of forming a highly conductive layer on the surface of second conductive layer.

8. A method as in claim 7 wherein said highly conductive region comprises a refractory metal silicide.

9. A method as in claim 2 further comprising the step of forming a highly conductive layer on the surface of fourth conductive layer.

10. A method as in claim 9 wherein said highly conductive region comprises a refractory metal silicide.

11. A method for forming a transistor, comprising the steps of:

forming field insulating regions surrounding an active device area in a face of a substrate;

forming a gate silicon dioxide layer on the surface of said active device area;

forming a gate on said gate silicon dioxide layer;

forming sidewall insulating layers on the sidewalls of said gate;

forming at least a first polysilicon layer on said gate insulating layer, said first polycrystalline silicon layer extending onto said field insulating regions;

removing the portion of said gate silicon dioxide layer between said first polycrystalline silicon layer and said sidewall insulating layers; and forming by selective epitaxial deposition a second silicon layer, said selective deposition being selective to the exposed portion of said substrate and said first polycrystalline silicon layer.

12. A method as in claim 11 further comprising the steps of:

forming a third polycrystalline silicon layer on said gate silicon dioxide layer, said third polycrystalline silicon layer extending onto said field insulating regions, said third polycrystalline silicon layer being positioned in opposition to said first polycrystalline silicon layer relative to said gate, said gate being positioned between said first and third polycrystalline silicon layers;

removing the portion of said gate silicon dioxide layer between said third polycrystalline silicon layer and said sidewall insulating layers; and forming by selective epitaxial deposition a fourth silicon layer, said selective deposition being selective to the exposed portion of said substrate and said third polycrystalline silicon layer.

13. A method of claim 11 further comprising the step of forming a doped region in said substrate by diffusing dopant atoms from said second silicon layer into said substrate.

14. A method as in claim 12 further comprising the step of forming a source and a drain in said substrate by diffusing dopant atoms from said second and fourth silicon layers into said substrate.

15. A method as in claim 11 wherein said insulating regions comprise silicon dioxide regions formed by thermal oxidation.

16. A method as in claim 11 wherein said substrate comprises crystalline silicon.

17. A method as in claim 11 further comprising the step of forming a highly conductive layer on the surface of second conductive layer.

18. A method as in claim 17 wherein said highly conductive region comprises a refractory metal silicide.

19. A method as in claim 12 further comprising the step of forming a highly conductive layer on the surface of fourth conductive layer.

20. A method as in claim 19 wherein said highly conductive region comprises a refractory metal silicide.

* * * * *